US010756181B1

(12) United States Patent
Kawakami et al.

(10) Patent No.: US 10,756,181 B1
(45) Date of Patent: Aug. 25, 2020

(54) SEMICONDUCTOR DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Akiyo Kawakami, Nomi (JP); Ryohei Gejo, Kawasaki (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/550,964

(22) Filed: Aug. 26, 2019

(30) Foreign Application Priority Data

Mar. 14, 2019 (JP) ................. 2019-047307

(51) Int. Cl.
*H01L 29/06* (2006.01)
*H01L 29/10* (2006.01)
*H01L 29/739* (2006.01)
*H01L 27/06* (2006.01)

(52) U.S. Cl.
CPC ...... *H01L 29/0696* (2013.01); *H01L 27/0664* (2013.01); *H01L 29/1095* (2013.01); *H01L 29/7397* (2013.01)

(58) Field of Classification Search
None
See application file for complete search history.

(56) References Cited

U.S. PATENT DOCUMENTS

| 2008/0093665 A1 | 4/2008 | Takehara |
| 2016/0276443 A1 | 9/2016 | Kono |
| 2017/0018548 A1 | 1/2017 | Laven et al. |
| 2018/0226399 A1 | 8/2018 | Tamaki et al. |
| 2019/0296132 A1* | 9/2019 | Tamaki ............ H01L 29/7397 |

FOREIGN PATENT DOCUMENTS

| JP | 2016-174030 A | 9/2016 |
| JP | 2017-22381 A | 1/2017 |
| JP | 2017-108097 A | 6/2017 |
| JP | 2018-129448 A | 8/2018 |

* cited by examiner

*Primary Examiner* — Thien F Tran
(74) *Attorney, Agent, or Firm* — Oblon, McClelland, Maier & Neustadt, L.L.P.

(57) ABSTRACT

According to one embodiment, a semiconductor device include first and second electrodes, first, second, third, fourth, fifth, and sixth semiconductor regions, a gate electrode, and an interconnect portion. The first semiconductor region is provided on the first electrode. The second semiconductor region is electrically connected to the first electrode and provided around the first semiconductor region. The third semiconductor region is provided on the first and second semiconductor regions. The fourth semiconductor region is provided on a portion of the third semiconductor region. The fifth semiconductor region is provided selectively on the fourth semiconductor region. The gate electrode opposes the fifth and fourth semiconductor regions, and the portion. The sixth semiconductor region is provided on another portion of the third semiconductor region. The second electrode is provided on the fourth and fifth semiconductor regions. The interconnect portion is electrically connected to the gate electrode.

7 Claims, 12 Drawing Sheets

SEMICONDUCTOR DEVICE

CROSS-REFERENCE TO RELATED APPLICATIONS

This application is based upon and claims the benefit of priority from Japanese Patent Application No. 2019-047307, filed on Mar. 14, 2019; the entire contents of which are incorporated herein by reference.

FIELD

Embodiments described herein relate generally to a semiconductor device.

BACKGROUND

A RC-IGBT (Reverse Conducting Insulated Gate Bipolar Transistor) in which a FWD (Free Wheeling Diode) is built into an IGBT (Insulated Gate Bipolar Transistor) is a semiconductor device used in power conversion and the like. It is desirable to develop technology that can suppress breakdown of such a semiconductor device.

DETAILED DESCRIPTION

Figure 1:
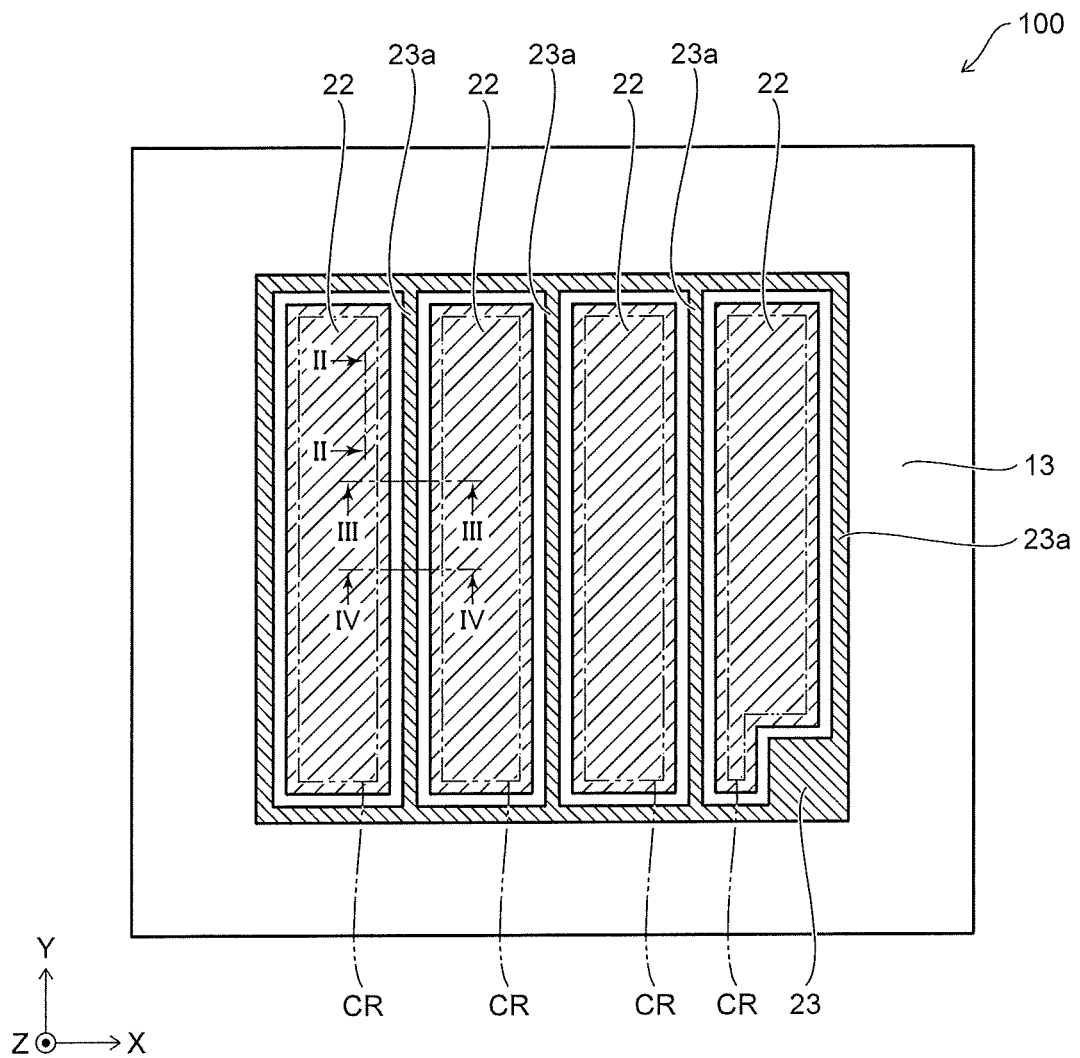
FIG. 1 is a plan view of a semiconductor device according to the embodiment.

According to one embodiment, a semiconductor device includes a first electrode, a first semiconductor region of a first conductivity type, a second semiconductor region of a second conductivity type, a third semiconductor region of the first conductivity type, a fourth semiconductor region of the second conductivity type, a fifth semiconductor region of the first conductivity type, a gate electrode, a sixth semiconductor region of the second conductivity type, a second electrode, and an interconnect portion. The first semiconductor region is provided on the first electrode and electrically connected to the first electrode. The second semiconductor region is electrically connected to the first electrode and provided around the first semiconductor region along a first plane crossing a first direction. The first direction is from the first electrode toward the first semiconductor region. The third semiconductor region is provided on the first semiconductor region and the second semiconductor region. An impurity concentration of the first conductivity type in the third semiconductor region is lower than an impurity concentration of the first conductivity type in the first semiconductor region. The fourth semiconductor region is provided on a portion of the third semiconductor region. The fifth semiconductor region is provided selectively on the fourth semiconductor region. The gate electrode opposes in a second direction with a gate insulating layer interposed, the fifth semiconductor region, the fourth semiconductor region, and the portion of the third semiconductor region. The second direction is perpendicular to the first direction. The sixth semiconductor region is provided on another portion of the third semiconductor region. An impurity concentration of the second conductivity type in the sixth semiconductor region is higher than an impurity concentration of the second conductivity type in the fourth semiconductor region. The second electrode is provided on the fourth semiconductor region and the fifth semiconductor region and electrically connected to the fourth semiconductor region, the fifth semiconductor region, and the sixth semiconductor region. The interconnect portion is electrically connected to the gate electrode, separated from the second electrode, and provided on the sixth semiconductor region with an insulating layer interposed. A proportion of a surface area along the first plane of the first semiconductor region positioned under the sixth semiconductor region to a surface area along the first plane of the second semiconductor region positioned under the sixth semiconductor region is smaller than a proportion of a surface area along the first plane of the first semiconductor region positioned under the fourth semiconductor region to a surface area along the first plane of the second semiconductor region positioned under the fourth semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the drawings and the description recited below, the notations of $n^+$, n, $n^-$, $p^+$, and p indicate relative levels of the impurity concentrations. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be performed by inverting the p-type and the n-type of each semiconductor region.

FIG. 1 is a plan view of a semiconductor device according to the embodiment.

Figure 2:
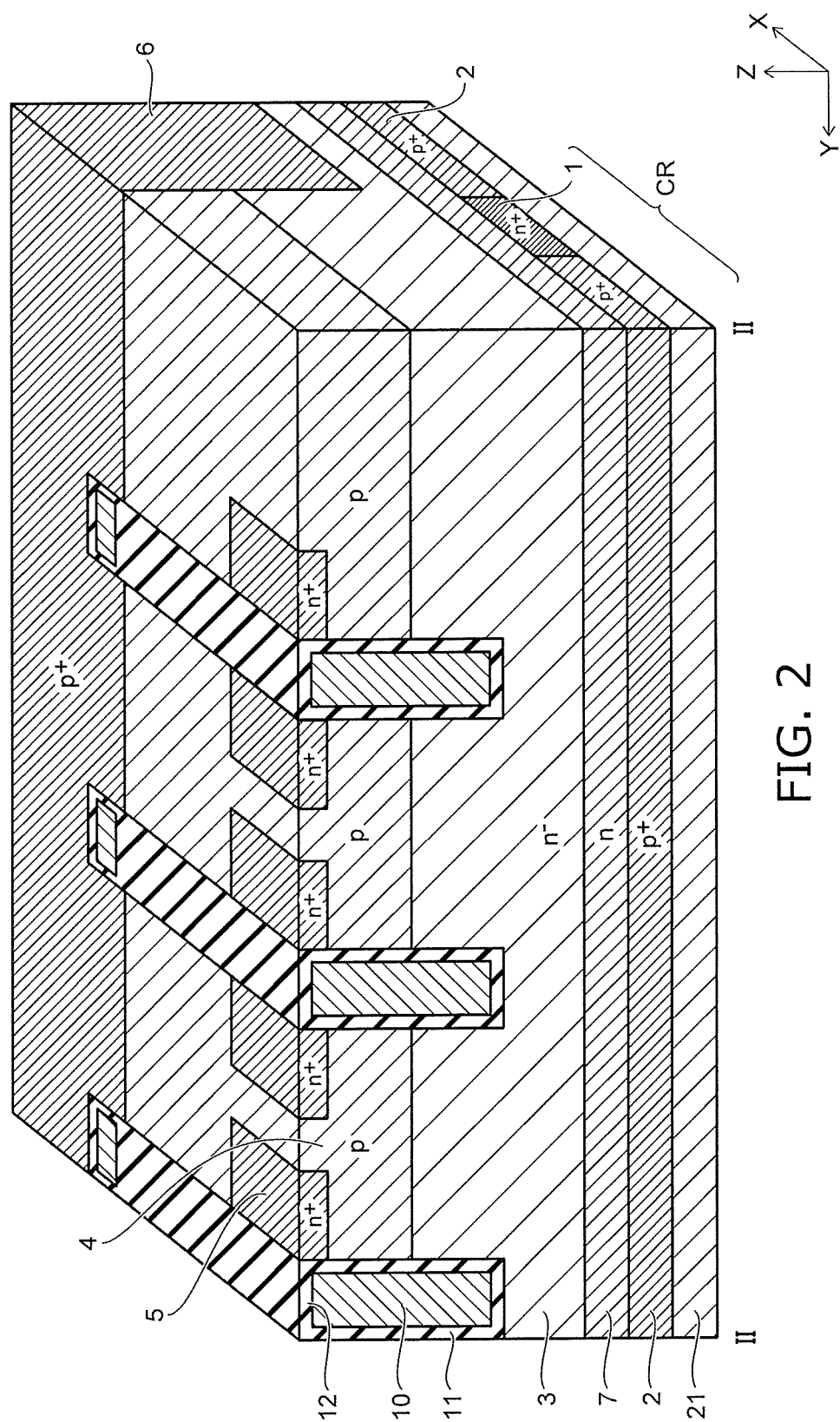
FIG. 2 is a perspective cross-sectional view including a II-II cross section of FIG. 1.

FIG. 2 is a perspective cross-sectional view including a II-II cross section of FIG. 1.

Figure 3:
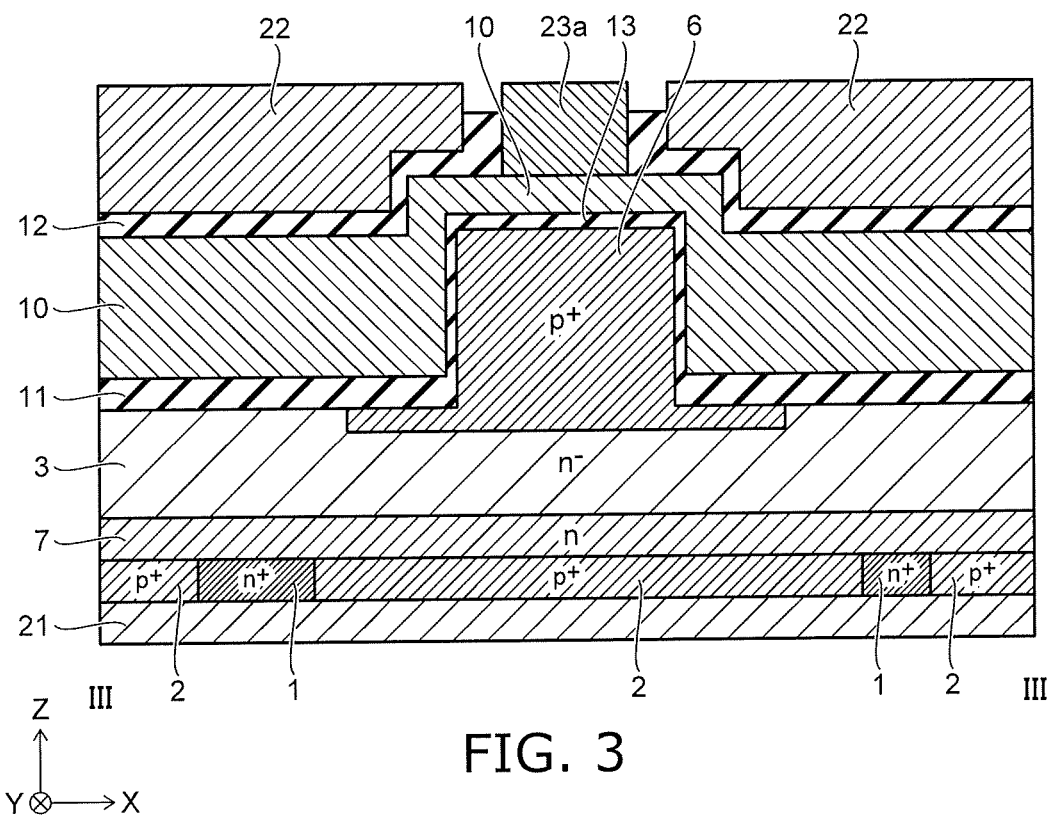
FIG. 3 is a III-III cross-sectional view of FIG. 1.

FIG. 3 is a III-III cross-sectional view of FIG. 1.

Figure 4:
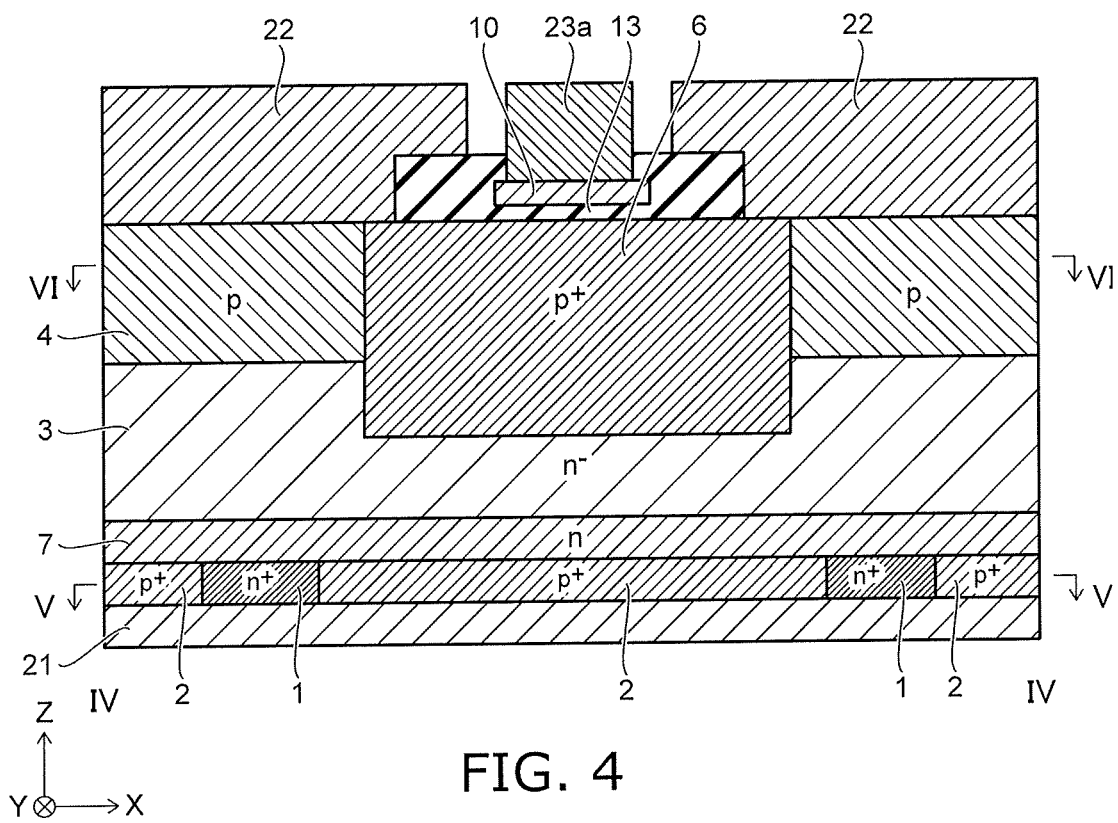
FIG. 4 is a IV-IV cross-sectional view of FIG. 1.

FIG. 4 is a IV-IV cross-sectional view of FIG. 1.

Figure 5:
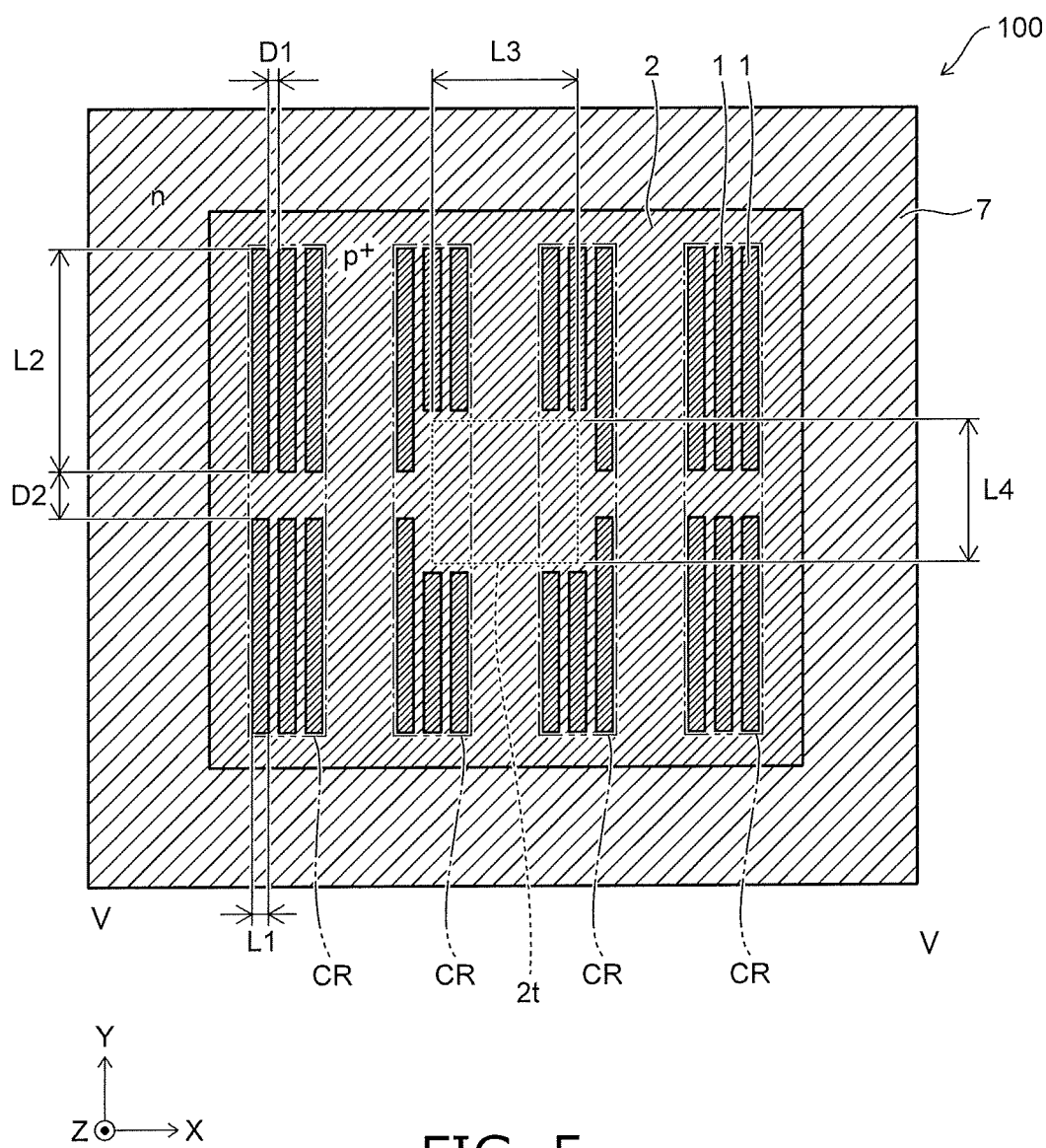
FIG. 5 is a V-V cross-sectional view of FIG. 4.

FIG. 5 is a V-V cross-sectional view of FIG. 4.

Figure 6:
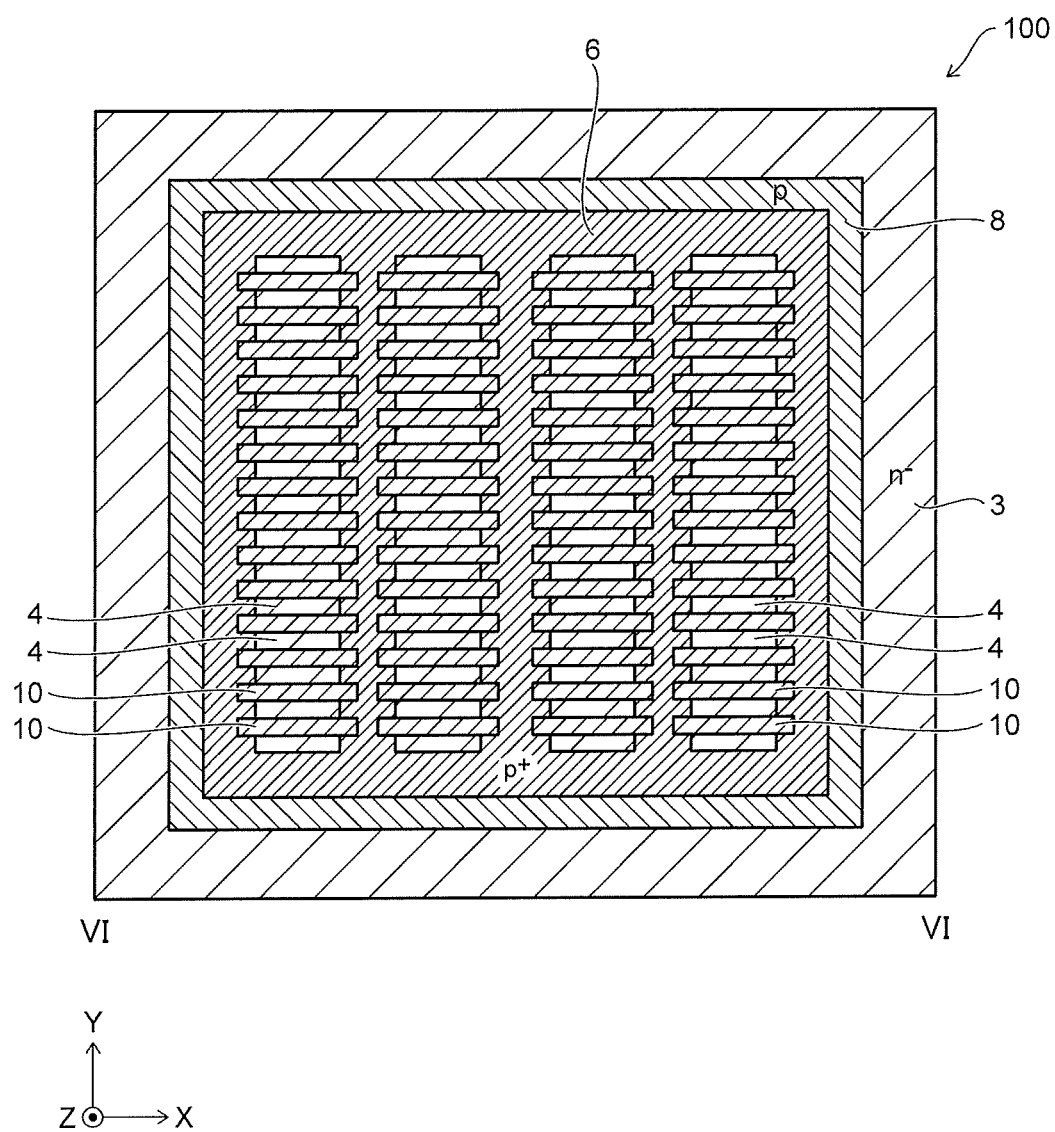
FIG. 6 is a VI-VI cross-sectional view of FIG. 4.

FIG. 6 is a VI-VI cross-sectional view of FIG. 4.

An insulating layer 13, an emitter electrode 22, and an interconnect portion 23a are not illustrated in FIG. 2. A gate insulating layer 11 is not illustrated in FIG. 6.

The semiconductor device 100 is an RC-IGBT. The semiconductor device 100 includes an $n^+$-type (first conductivity-type) cathode region 1 (a first semiconductor region), a $p^+$-type (second conductivity-type) collector region 2 (a second semiconductor region), an $n^-$-type drift region 3 (a third semiconductor region), a p-type base region 4 (a fourth semiconductor region), an $n^+$-type emitter region 5 (a fifth semiconductor region), a $p^+$-type finger region 6 (a sixth semiconductor region), an n-type buffer region 7, a p-type guard ring region 8, a gate electrode 10, a collector electrode 21, an emitter electrode 22, and a gate pad 23.

An XYZ orthogonal coordinate system is used in the description of the embodiments. A direction from the collector electrode 21 toward the $n^+$-type cathode region 1 is taken as a Z-direction (a first direction). Two mutually-orthogonal directions perpendicular to the Z-direction are taken as an X-direction (a third direction) and a Y-direction (a second direction). For the description, the direction from the collector electrode 21 toward the $n^+$-type cathode region 1 is called "up;" and the reverse direction is called "down." These directions are based on the relative positional relationship between the collector electrode 21 and the $n^+$-type cathode region 1 and are independent of the direction of gravity.

As illustrated in FIG. 1, the emitter electrode 22 and the gate pad 23 are provided to be separated from each other on the upper surface of the semiconductor device 100. The semiconductor device 100 includes a cell region CR that operates as an IGBT. The emitter electrode 22 is provided in the cell region CR. For example, in the semiconductor device 100, multiple cell regions CR are provided in the X-direction. Multiple emitter electrodes 22 are provided respectively on the multiple cell regions CR. The gate pad 23 includes the interconnect portion 23a. The interconnect portion 23a is provided around each emitter electrode 22 along the X-Y plane (a first plane) perpendicular to the Z-direction. The insulating layer 13 is provided between the gate pad 23 and each emitter electrode 22 and around the gate pad 23.

As illustrated in FIG. 2, the collector electrode 21 is provided at the lower surface of the semiconductor device 100. The $n^+$-type cathode region 1 and the $p^+$-type collector region 2 are provided on the collector electrode 21 and electrically connected to the collector electrode 21. As illustrated in FIG. 2 and FIG. 5, the $p^+$-type collector region 2 is provided around the $n^+$-type cathode region 1 along the X-Y plane.

As illustrated in FIG. 2, the n-type buffer region 7 is provided on the $n^+$-type cathode region 1 and the $p^+$-type collector region 2. The $n^-$-type drift region 3 is provided on the n-type buffer region 7. The p-type base region 4 is provided on a portion of the $n^-$-type drift region 3. The $n^+$-type emitter region 5 is provided selectively on the p-type base region 4. The gate electrode 10 opposes, in the Y-direction with the gate insulating layer 11 interposed, the portion of the $n^-$-type drift region 3, the p-type base region 4, and the $n^+$-type emitter region 5.

The emitter electrode 22 is provided on the p-type base region 4, the $n^+$-type emitter region 5, and the gate electrode 10 and is electrically connected to the p-type base region 4 and the $n^+$-type emitter region 5. As illustrated in FIG. 2 and FIG. 3, an insulating layer 12 is provided between the gate electrode 10 and the emitter electrode 22; and the gate electrode 10 and the emitter electrode 22 are electrically isolated.

The $p^+$-type finger region 6 is provided on another portion of the $n^-$-type drift region 3. As illustrated in FIG. 6, the $p^+$-type finger region 6 is provided around the cell regions CR along the X-Y plane. As illustrated in FIG. 3, the gate electrode 10 is drawn upward at a position where the $p^+$-type finger region 6 is provided. The gate electrode 10 and the interconnect portion 23a are provided on the $p^+$-type finger region 6 with the insulating layer 13 interposed; and the gate electrode 10 is electrically connected to the interconnect portion 23a.

In the example illustrated in FIG. 4, the emitter electrode 22 is provided on a portion of the $p^+$-type finger region 6; and the $p^+$-type finger region 6 is electrically connected to the emitter electrode 22. Or, the $p^+$-type finger region 6 may be electrically connected to the emitter electrode 22 via the p-type base region 4. The p-type impurity concentration in the $p^+$-type finger region 6 is higher than the p-type impurity concentration in the p-type base region 4. For example, the lower end of the $p^+$-type finger region 6 is positioned lower than the lower end of the p-type base region 4 and the lower end of the gate insulating layer 11.

As illustrated in FIG. 6, the p-type guard ring region 8 is provided around the $p^+$-type finger region 6 along the X-Y plane. For example, the p-type impurity concentration in the $p^+$-type finger region 6 is higher than the p-type impurity concentration in the p-type guard ring region 8.

The example illustrated in FIG. 2 to FIG. 6 will now be described in detail.

Each cell region CR includes multiple $n^+$-type cathode regions 1, a portion of the $p^+$-type collector region 2, a portion of the $n^-$-type drift region 3, multiple p-type base regions 4, multiple $n^+$-type emitter regions 5, a portion of the n-type buffer region 7, multiple gate electrodes 10, and one emitter electrode 22.

In each cell region CR as illustrated in FIG. 5, the multiple $n^+$-type cathode regions 1 are separated from each other in the X-direction and the Y-direction. A length L1 in the X-direction of the $n^+$-type cathode region 1 is shorter than a length L2 in the Y-direction of the $n^+$-type cathode region 1. For example, a distance D1 between the $n^+$-type cathode regions 1 adjacent to each other in the X-direction is shorter than a distance D2 between the $n^+$-type cathode regions 1 adjacent to each other in the Y-direction. The distance D2 is shorter than the length L2 and longer than the length L1. In the illustrated example, three $n^+$-type cathode regions 1 are arranged in the X-direction in one cell region CR. The number of the $n^+$-type cathode regions 1 arranged in the X-direction in one cell region CR is not limited to the example and is modifiable as appropriate.

As illustrated in FIG. 6, the gate electrode 10 and the p-type base region 4 are provided alternately in the Y-direction in each cell region CR. Multiple $n^+$-type emitter regions 5 are selectively provided on each p-type base region 4.

An other portion of the $p^+$-type collector region 2, the $p^+$-type finger region 6, and the interconnect portion 23a are provided around each cell region CR along the X-Y plane. That is, a portion of the $p^+$-type finger region 6 is provided between the multiple p-type base regions 4 and the multiple gate electrodes 10 included in one cell region CR in the X-direction and the multiple p-type base regions 4 and the multiple gate electrodes 10 included in another one cell region CR.

The proportion of the surface area along the X-Y plane of the $n^+$-type cathode region 1 positioned under the $p^+$-type finger region 6 to the surface area along the X-Y plane of the $p^+$-type collector region 2 positioned under the $p^+$-type finger region 6 is smaller than the proportion of the surface area along the X-Y plane of the $n^+$-type cathode region 1 positioned under the p-type base region 4 to the surface area along the X-Y plane of the $p^+$-type collector region 2 positioned under the p-type base region 4. The surface area along the X-Y plane of the $n^+$-type cathode region 1 positioned under the $p^+$-type finger region 6 may be greater than zero or may be zero. In other words, the $n^+$-type cathode region 1 may not be provided under the $p^+$-type finger region 6.

The relationships of the proportions will now be described in detail with reference to FIG. 7A to FIG. 7C.

Figure 7A:
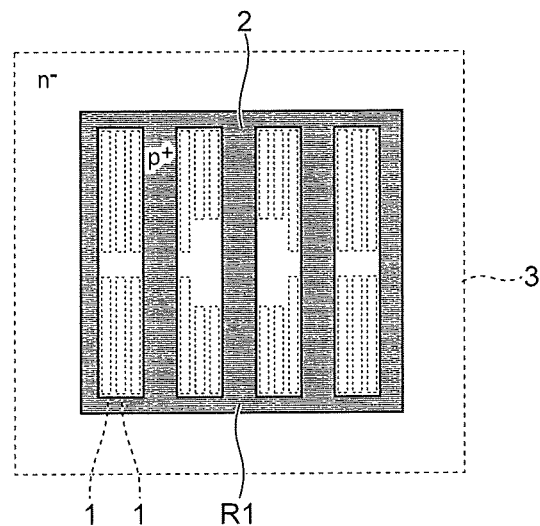
FIGS. 7A to 7C are plan views for describing the semiconductor device according to the embodiment.
Figure 7B:
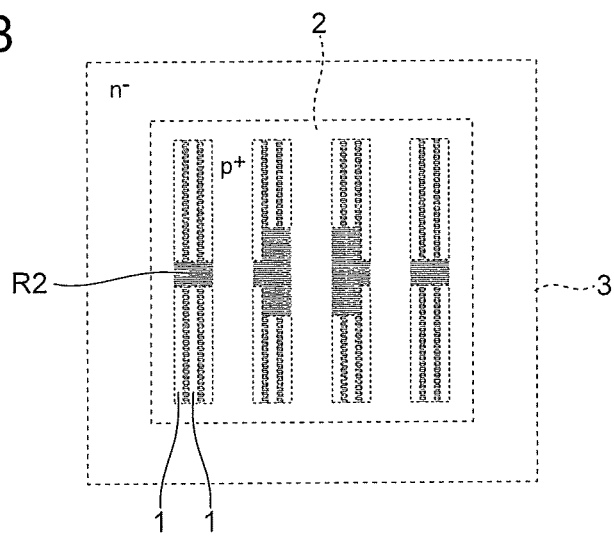
Figure 7C:
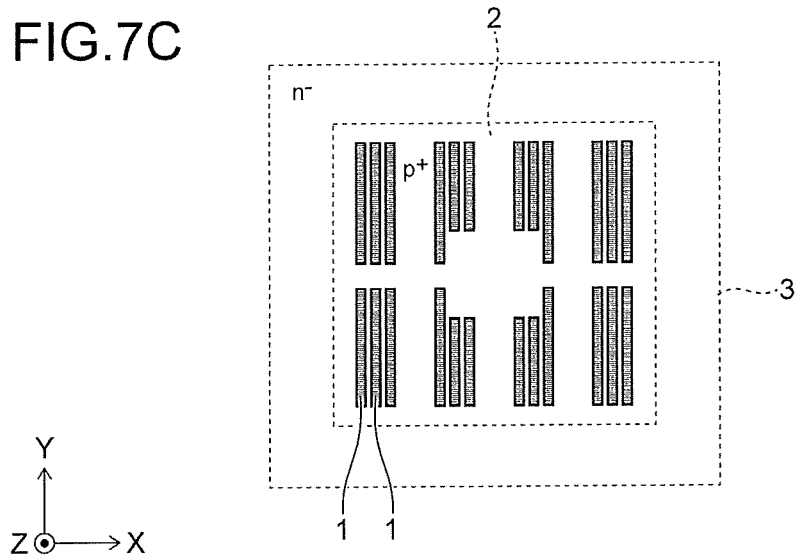

FIGS. 7A to 7C are plan views for describing the semiconductor device according to the embodiment.

FIG. 7A to FIG. 7C correspond to a V-V cross-sectional view of FIG. 4. A portion of the $p^+$-type collector region 2 positioned under the $p^+$-type finger region 6 is taken as a region R1. An other portion of the $p^+$-type collector region 2 positioned under the p-type base region 4 is taken as a region R2. In FIG. 7A, only the region R1 is illustrated by marking with dots; and the other portions are illustrated by broken lines. In FIG. 7B, only the region R2 is illustrated by marking with dots; and the other portions are illustrated by broken lines. In FIG. 7C, only the $n^+$-type cathode region 1 positioned under the p-type base region 4 is illustrated by marking with dots; and the other portions are illustrated by broken lines.

A surface area A1 along the X-Y plane of the region R1 is illustrated by the surface area of the region marked with the dots illustrated in FIG. 7A. A surface area A2 along the X-Y plane of the $n^+$-type cathode region 1 positioned under the $p^+$-type finger region 6 is zero. A surface area A3 along the X-Y plane of the region R2 is illustrated by the surface area of the region marked with the dots illustrated in FIG. 7B. A surface area A4 along the X-Y plane of the $n^+$-type cathode region 1 is illustrated by the surface area of the region marked with the dots illustrated in FIG. 7C. The proportion of the surface area A2 to the surface area A1 is zero and is smaller than the proportion of the surface area A4 to the surface area A3.

The operation of the semiconductor device 100 will now be described.

A voltage that is not less than a threshold is applied to the gate electrode 10 in a state in which a voltage that is positive with respect to the emitter electrode 22 is applied to the collector electrode 21. Thereby, a channel (an inversion layer) is formed in the p-type base region 4; and an IGBT operation is started in the cell region CR. Electrons from the emitter electrode 22 pass through the $n^+$-type emitter region 5 and the channel and flow toward the $n^-$-type drift region 3. Holes from the collector electrode 21 pass through the $p^+$-type collector region 2 and flow toward the $n^-$-type drift region 3. Subsequently, when the voltage applied to the gate electrode 10 becomes lower than the threshold, the channel in the p-type base region 4 disappears; and the IGBT operation ends.

For example, a bridge circuit is configured using multiple semiconductor devices 100. When the IGBT operation of one semiconductor device 100 of the bridge circuit ends, an induced electromotive force is applied to the emitter electrode 22 of another semiconductor device 100 by an inductance component of the circuit. When the induced electromotive force is applied to the emitter electrode 22, the other semiconductor device 100 operates as a diode. In the diode operation, holes from the emitter electrode 22 pass through the p-type base region 4 and the $p^+$-type finger region 6 and flow toward the $n^-$-type drift region 3. Electrons from the collector electrode 21 pass through the $n^+$-type cathode region 1 and flow toward the $n^-$-type drift region 3.

When the diode operation of the semiconductor device 100 ends, the holes that have accumulated in the $n^-$-type drift region 3 pass through the p-type base region 4 and the $p^+$-type finger region 6 and are ejected to the emitter electrode 22. The electrons that have accumulated in the $n^-$-type drift region 3 pass through the $n^+$-type cathode region 1 and are ejected to the collector electrode 21.

The $p^+$-type collector region 2 includes, for example, a trigger region 2t as illustrated in FIG. 5. The multiple $n^+$-type cathode regions 1 are provided around the trigger region 2t along the X-Y plane.

Specifically, a portion of the trigger region 2t is provided in one of the multiple cell regions CR. The portion of the trigger region 2t in the one of the multiple cell regions CR is positioned between a portion of the multiple $n^+$-type cathode regions 1 of the one of the multiple cell regions CR and another portion of the multiple $n^+$-type cathode regions 1 of the one of the multiple cell regions CR in the Y-direction.

An other portion of the trigger region 2t is provided in another one of the multiple cell regions CR. The other one of the multiple cell regions CR is adjacent to the one of the multiple cell regions CR in the X-direction. The other portion of the trigger region 2t in the other one of the multiple cell regions CR is positioned between a portion of the multiple $n^+$-type cathode regions 1 of the other one of the multiple cell regions CR and another portion of the multiple $n^+$-type cathode regions 1 of the other one of the multiple cell regions CR in the Y-direction.

For example, the trigger region 2t is provided at the central portion of the $p^+$-type collector region 2 in the X-direction and the Y-direction. The $n^+$-type cathode region 1 is not provided in the trigger region 2t. A length L3 in the X-direction of the trigger region 2t and a length L4 in the Y-direction of the trigger region 2t are longer than the distance D1 and longer than the distance D2. By providing the trigger region 2t, injection of the holes into the $n^-$-type drift region 3 can be faster when starting the IGBT operation.

Examples of the materials of the components will now be described.

The $n^+$-type cathode region 1, the $p^+$-type collector region 2, the $n^-$-type drift region 3, the p-type base region 4, the $n^+$-type emitter region 5, the $p^+$-type finger region 6, the n-type buffer region 7, and the p-type guard ring region 8 include silicon, silicon carbide, gallium nitride, or gallium arsenide as semiconductor materials. In the case where silicon is used as the semiconductor material, arsenic, phosphorus, or antimony can be used as an n-type impurity. Boron can be used as a p-type impurity.

The gate electrode 10 includes a conductive material such as polysilicon, etc.

The gate insulating layer 11, the insulating layer 12, and the insulating layer 13 include an insulating material such as silicon oxide, etc.

The collector electrode 21, the emitter electrode 22, and the gate pad 23 include a metal such as aluminum, etc.

Effects of the embodiment will now be described.

When the diode operation of the semiconductor device 100 ends, the holes that have accumulated in the $n^-$-type drift region 3 pass through the p-type base region 4 and the p+-type finger region 6 and are ejected to the emitter electrode 22 as described above. The p-type impurity concentration in the p+-type finger region 6 is higher than the p-type impurity concentration in the p-type base region 4. Therefore, more holes flow in the p+-type finger region 6 than in the p-type base region 4 of the cell region CR.

The emitter electrode 22 is provided on the entire surface of the cell region CR but is not provided or is provided only partially on the p+-type finger region 6. Or, the emitter electrode 22 is not provided on the p+-type finger region 6; and the p+-type finger region 6 is electrically connected to the emitter electrode 22 via the p-type base region 4. This is because the interconnect portion 23a is provided on the p+-type finger region 6. Therefore, the holes that flow in the p+-type finger region 6 are not ejected easily to the emitter electrode 22 compared to the holes flowing in the p-type base region 4; and the time until being ejected to the emitter electrode 22 is long. As a result, the potential in the p+-type finger region 6 may increase; and breakdown of the semiconductor device 100 at the vicinity of the p+-type finger region 6 may occur. For example, the potential in the p+-type finger region 6 increases; and dielectric breakdown occurs between the p+-type finger region 6 and the gate electrode 10.

In the semiconductor device 100 according to the embodiment, the proportion of the surface area of the n+-type cathode region 1 positioned under the p+-type finger region 6 to the surface area of the p+-type collector region 2 positioned under the p+-type finger region 6 is smaller than the proportion of the surface area of the n+-type cathode region 1 positioned under the p-type base region 4 to the surface area of the p+-type collector region 2 positioned under the p-type base region 4. In other words, under the p+-type finger region 6, the surface area of the n+-type cathode region 1 is small; or the n+-type cathode region 1 is not provided. According to this configuration, the injection of the electrons into a portion of the n−-type drift region 3 positioned under the p+-type finger region 6 in the diode operation of the semiconductor device 100 is suppressed. By suppressing the injection of the electrons into the portion of the n−-type drift region 3, the injection of the holes from the p+-type finger region 6 into the portion of the n−-type drift region 3 also is suppressed. Thereby, when the diode operation of the semiconductor device 100 ends, the amount of the holes passing through the p+-type finger region 6 and flowing toward the emitter electrode 22 can be reduced. As a result, the likelihood of breakdown of the semiconductor device 100 can be reduced.

It is desirable for the lower end of the p+-type finger region 6 to be lower than the lower end of the gate electrode 10 and to overlap a portion of the gate electrode 10 (the end portion in the X-direction of the gate electrode 10) in the Z-direction. According to this configuration, electric field concentration at the end portion of the gate electrode 10 can be relaxed when the semiconductor device 100 is in the off-state; and the likelihood of breakdown of the semiconductor device 100 can be reduced further.

It is more desirable for the n+-type cathode region 1 not to be provided under the p+-type finger region 6. Thereby, in the diode operation of the semiconductor device 100, the injection of carriers into the portion where the p+-type finger region 6 is provided can be suppressed further.

First Variation

Figure 8:
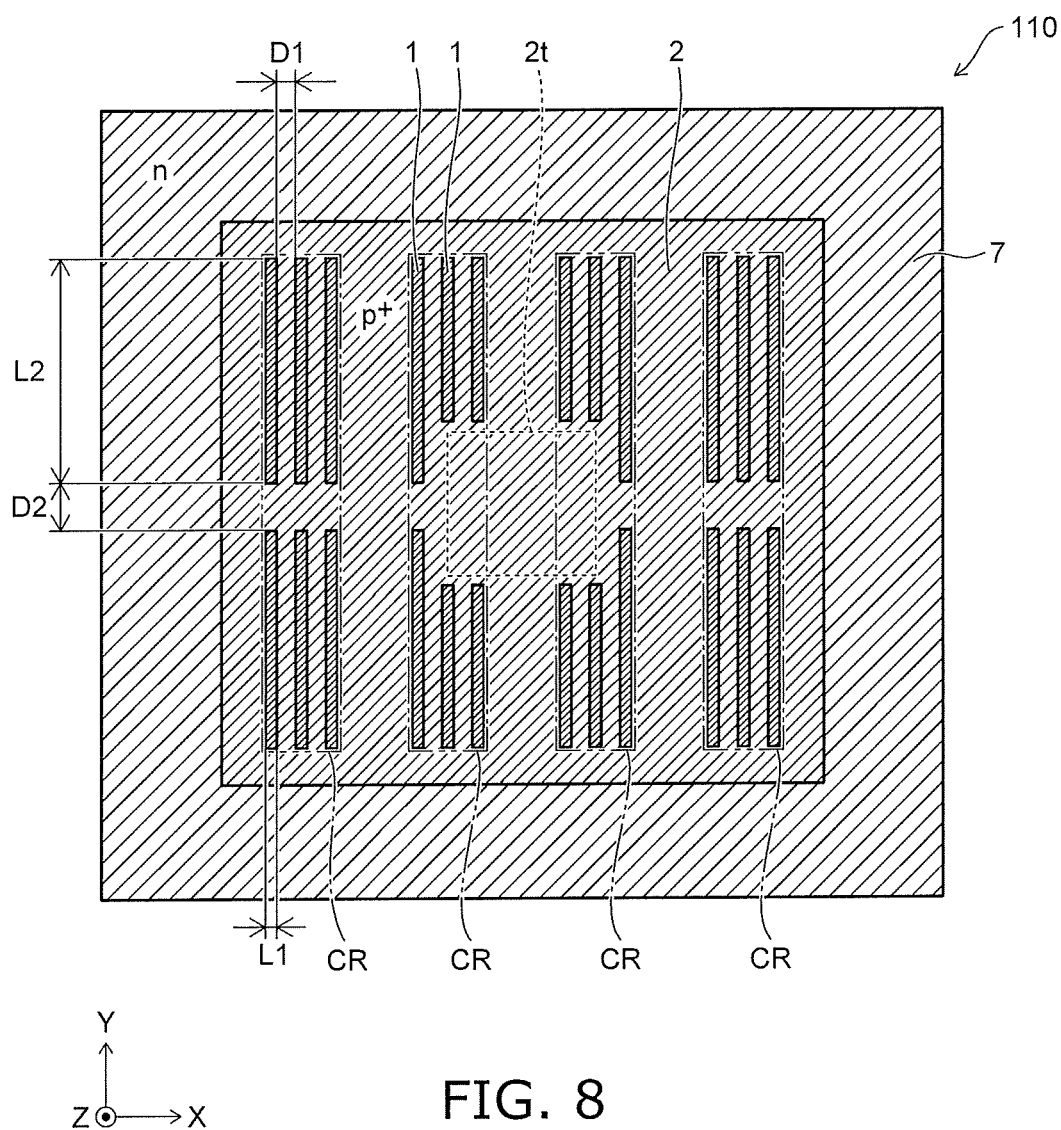
FIG. 8 is a plan view illustrating a semiconductor device according to a first variation of the embodiment.

FIG. 8 is a plan view illustrating a semiconductor device according to a first variation of the embodiment.

FIG. 8 illustrates an X-Y cross section passing through the n+-type cathode region 1 and the p+-type collector region 2 of the semiconductor device 110 according to the first variation. In the semiconductor device 110 illustrated in FIG. 8, the distance D1 between the n+-type cathode regions 1 adjacent to each other in the X-direction is long compared to that of the semiconductor device 100. For example, the distance D1 is longer than the length L1 in the X-direction of the n+-type cathode region 1.

In the semiconductor device 110, similarly to the semiconductor device 100, the proportion of the surface area along the X-Y plane of the n+-type cathode region 1 positioned under the p+-type finger region 6 to the surface area along the X-Y plane of the p+-type collector region 2 positioned under the p+-type finger region 6 is smaller than the proportion of the surface area along the X-Y plane of the n+-type cathode region 1 positioned under the p-type base region 4 to the surface area along the X-Y plane of the p+-type collector region 2 positioned under the p-type base region 4. According to the first variation, the injection of carriers into the portion where the p+-type finger region 6 is provided in the diode operation of the semiconductor device 110 can be suppressed. The likelihood of breakdown of the semiconductor device 110 can be reduced thereby.

Second Variation

Figure 9:
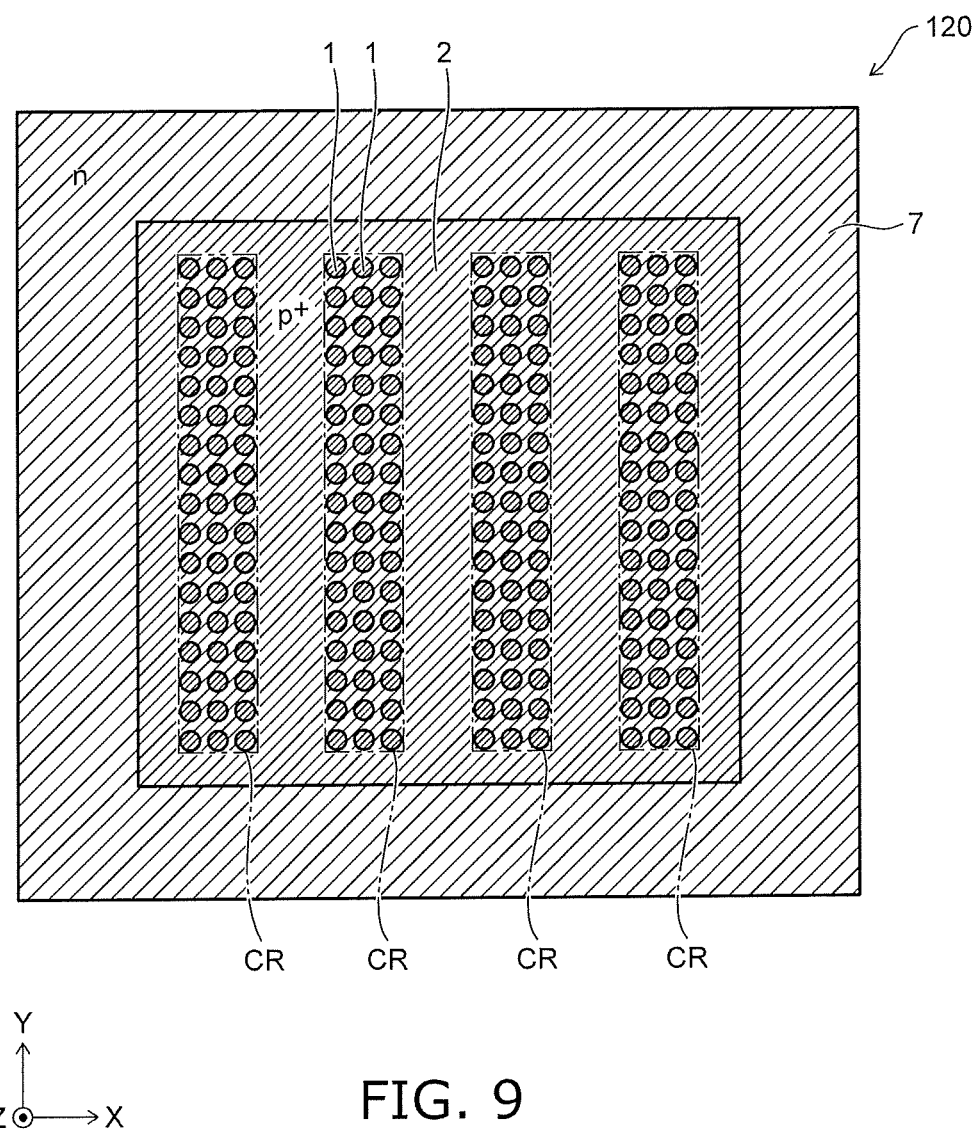
FIG. 9 is a plan view illustrating a semiconductor device according to a second variation of the embodiment.

FIG. 9 is a plan view illustrating a semiconductor device according to a second variation of the embodiment.

FIG. 9 illustrates an X-Y cross section passing through the n+-type cathode region 1 and the p+-type collector region 2 of the semiconductor device 120 according to the second variation. In the semiconductor device 120 illustrated in FIG. 9, multiple n+-type cathode regions 1 are provided in the X-direction and the Y-direction in each cell region CR.

The length L1 in the X-direction of the n+-type cathode region 1 is, for example, substantially the same as the length L2 in the Y-direction of the n+-type cathode region 1. The length L1 and the length L2 are longer than the distance D1 between the n+-type cathode regions 1 adjacent to each other in the X-direction and longer than the distance D2 between the n+-type cathode regions 1 adjacent to each other in the Y-direction.

In the semiconductor device 120 as well, the proportion of the surface area along the X-Y plane of the n+-type cathode region 1 positioned under the p+-type finger region 6 to the surface area along the X-Y plane of the p+-type collector region 2 positioned under the p+-type finger region 6 is smaller than the proportion of the surface area along the X-Y plane of the n+-type cathode region 1 positioned under the p-type base region 4 to the surface area along the X-Y plane of the p+-type collector region 2 positioned under the p-type base region 4. According to the second variation, the likelihood of breakdown of the semiconductor device 120 can be reduced.

As long as the relationship of the proportions described above is satisfied, the size of the n+-type cathode region 1, the number of the n+-type cathode regions 1, the distance between the n+-type cathode regions 1, etc., are modifiable as appropriate as illustrated in FIG. 8 and FIG. 9.

Third Variation

Figure 10:
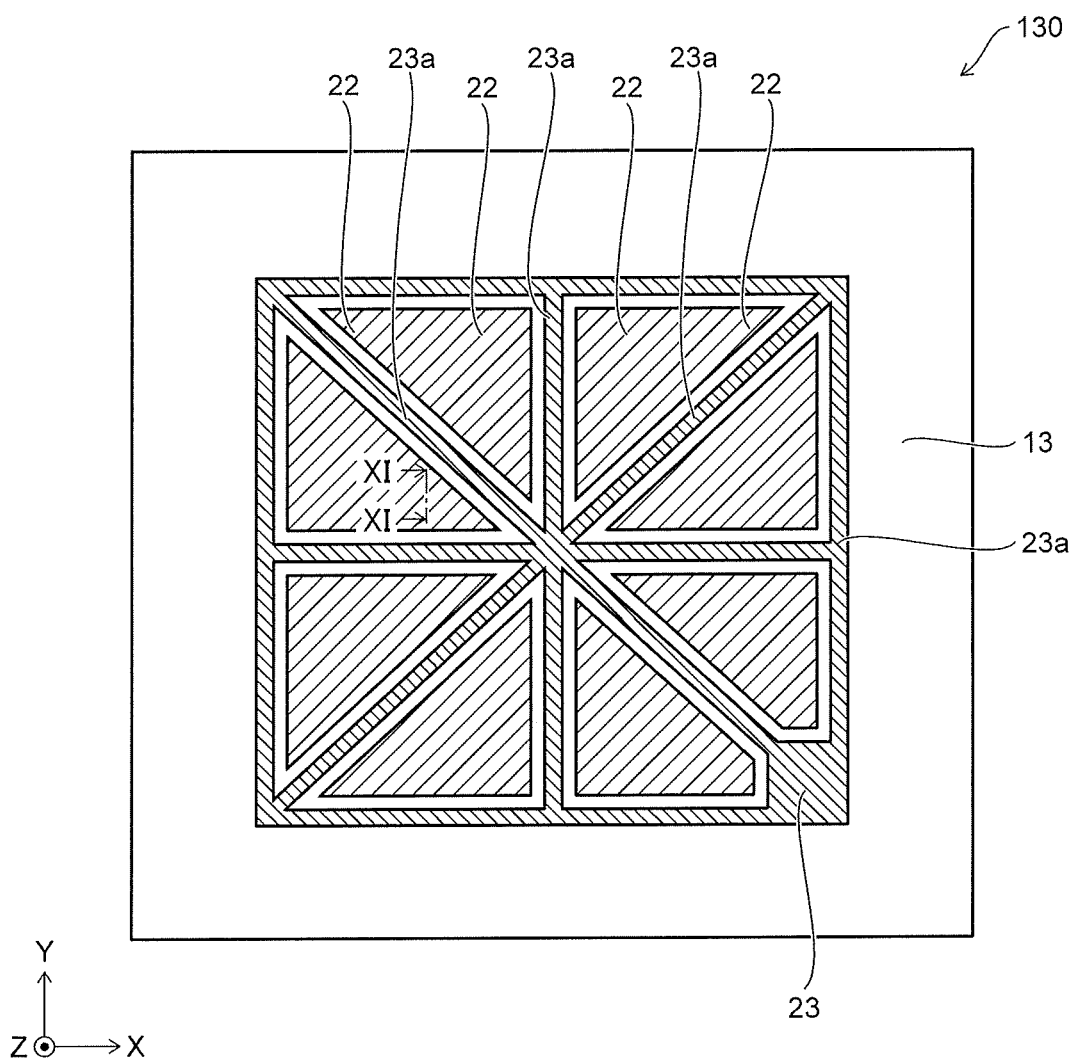
FIG. 10 is a plan view of a semiconductor device according to a third variation of the embodiment.

FIG. 10 is a plan view of a semiconductor device according to a third variation of the embodiment.

Figure 11:
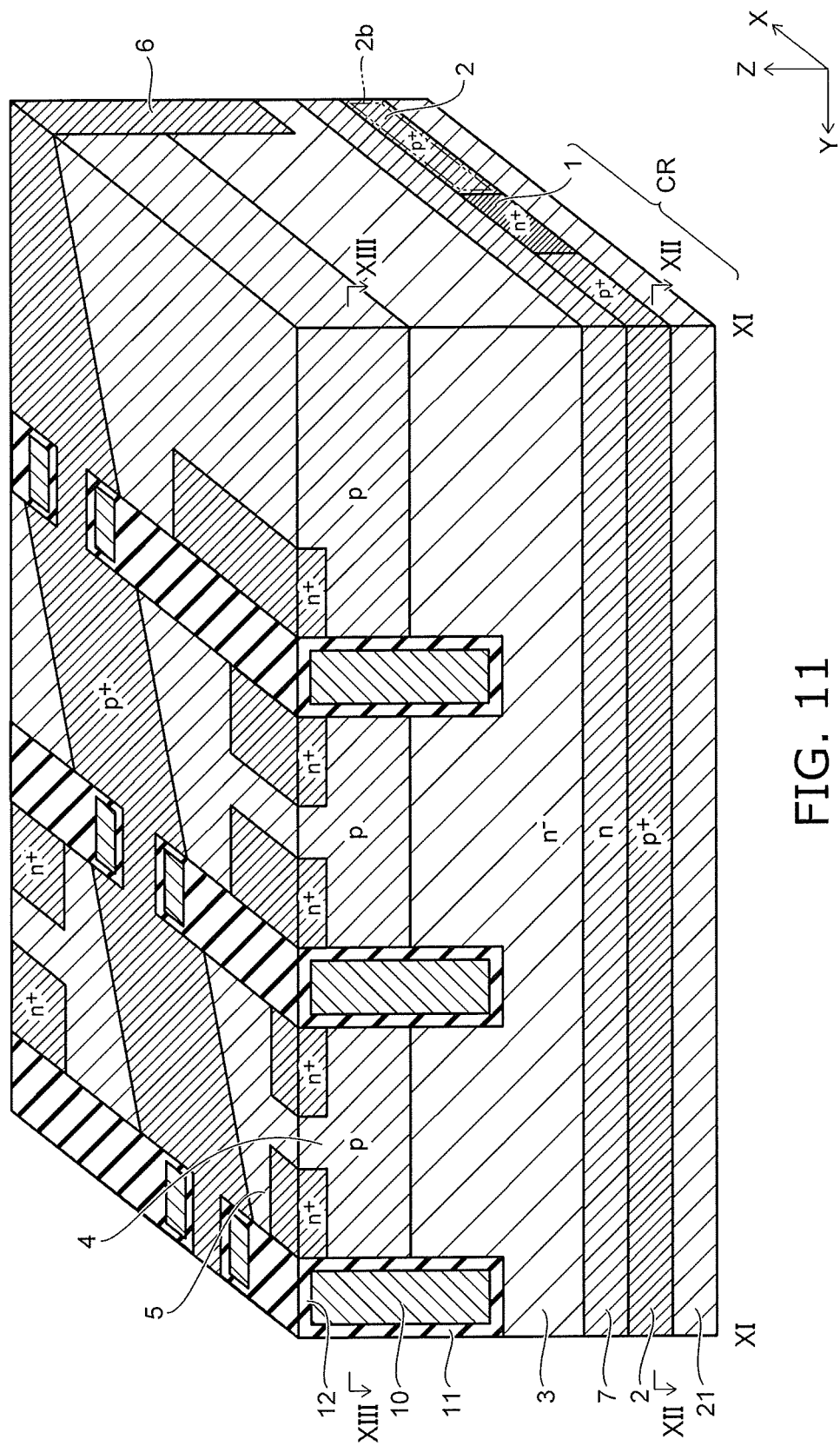
FIG. 11 is a perspective cross-sectional view including a XI-XI cross section of FIG. 10.

FIG. 11 is a perspective cross-sectional view including a XI-XI cross section of FIG. 10.

Figure 12:
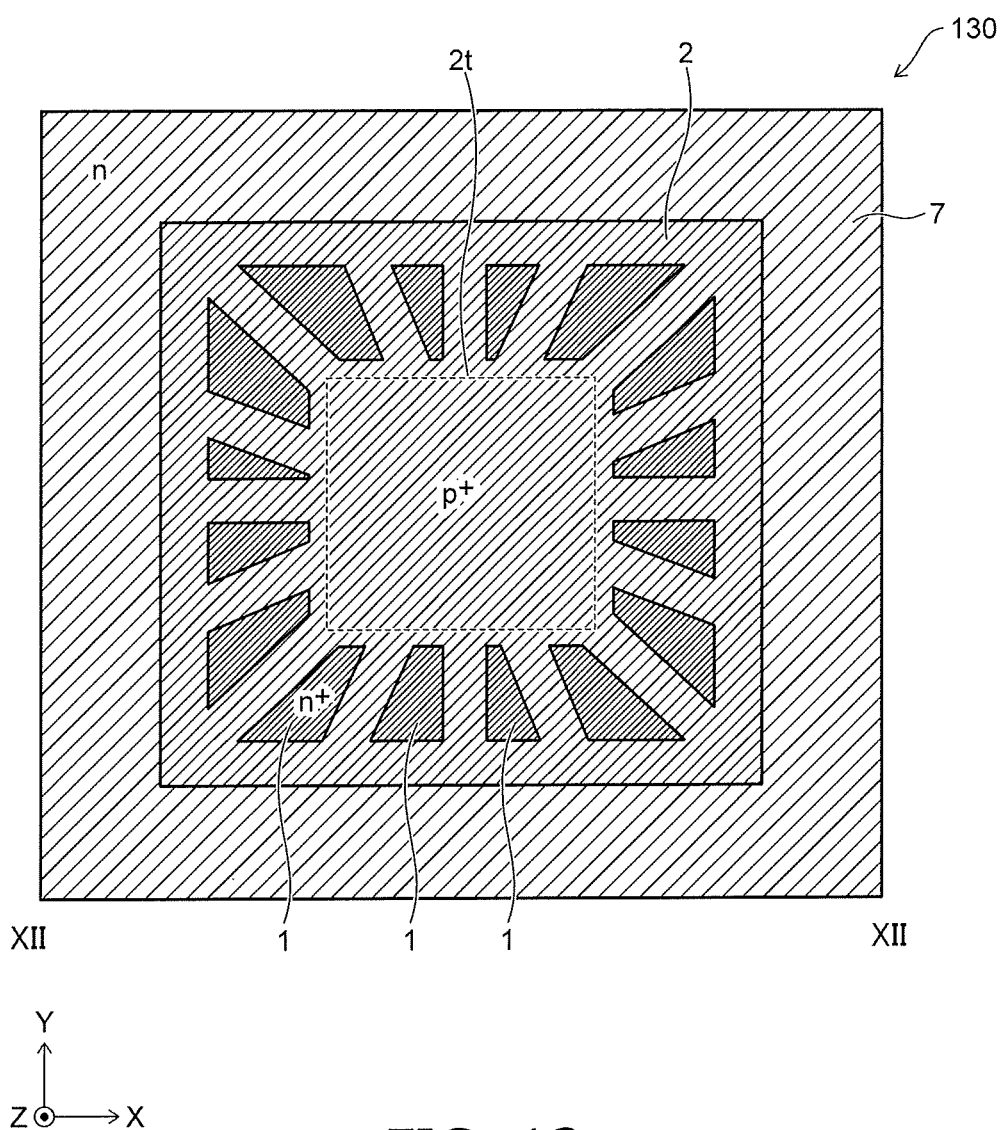
FIG. 12 is a XII-XII cross-sectional view of FIG. 11.

FIG. 12 is a XII-XII cross-sectional view of FIG. 11.

Figure 13:
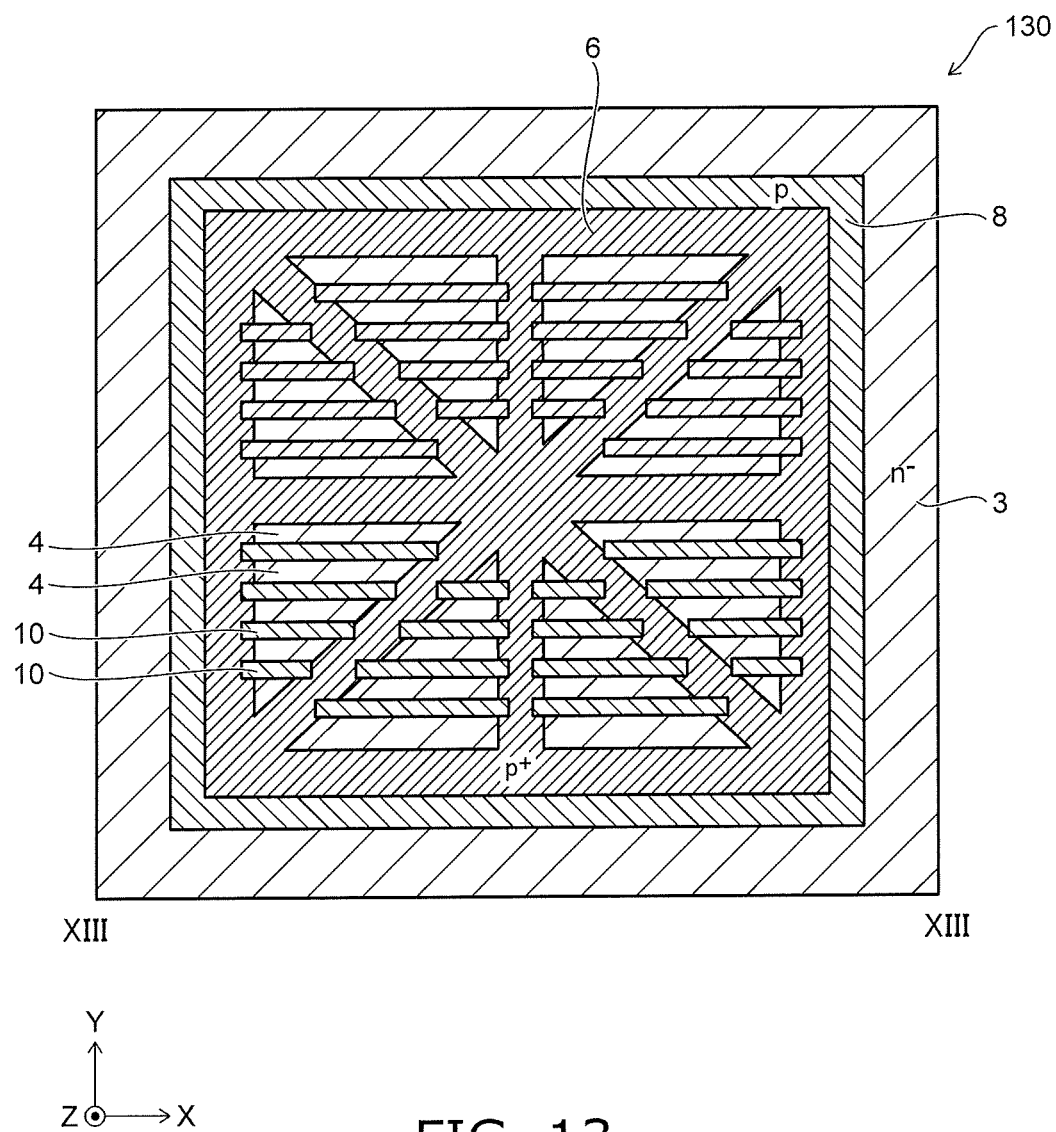
FIG. 13 is a XIII-XIII cross-sectional view of FIG. 11.

FIG. 13 is a XIII-XIII cross-sectional view of FIG. 11.

The emitter electrode 22, the interconnect portion 23a, etc., are not illustrated in FIG. 11.

In the semiconductor device 130 according to the third variation as illustrated in FIG. 10, multiple emitter electrodes 22 are arranged in a circumferential direction around the Z-direction. In other words, in the semiconductor device 130, the multiple cell regions CR are arranged in the circumferential direction around the Z-direction. The interconnect portion 23a of the gate pad 23 is provided around each cell region CR along the X-Y plane. For example, portions of the interconnect portion 23a extend radially from a position surrounded with the multiple emitter electrodes 22.

As illustrated in FIG. 12, the multiple $n^+$-type cathode regions 1 are arranged in the circumferential direction around the Z-direction. The $p^+$-type collector region 2 is provided around each $n^+$-type cathode region 1. For example, the $p^+$-type collector region 2 includes the trigger region 2t. The multiple $n^+$-type cathode regions 1 are provided around the trigger region 2t along the X-Y plane. Portions of the $p^+$-type collector region 2 extend radially with the trigger region 2t as the center.

In each cell region CR as illustrated in FIG. 11 and FIG. 13, the multiple p-type base regions 4, the multiple $n^+$-type emitter regions 5, and the multiple gate electrodes 10 extend in the X-direction. The $p^+$-type finger region 6 is provided around each cell region CR along the X-Y plane and surrounds the multiple p-type base regions 4, the multiple $n^+$-type emitter regions 5, and the multiple gate electrodes 10. The $p^+$-type finger region 6 is positioned between the $p^+$-type collector region 2 and the interconnect portion 23a in the Z-direction. Portions of the $p^+$-type finger region 6 extend radially from a position surrounded with the multiple cell regions CR.

In the semiconductor device 130 as well, the proportion of the surface area along the X-Y plane of the $n^+$-type cathode region 1 positioned under the $p^+$-type finger region 6 to the surface area along the X-Y plane of the $p^+$-type collector region 2 positioned under the $p^+$-type finger region 6 is smaller than the proportion of the surface area along the X-Y plane of the $n^+$-type cathode region 1 positioned under the p-type base region 4 to the surface area along the X-Y plane of the $p^+$-type collector region 2 positioned under the p-type base region 4. In the example illustrated in FIG. 11 and FIG. 12, the surface area along the X-Y plane of the $n^+$-type cathode region 1 positioned under the $p^+$-type finger region 6 is zero. The likelihood of breakdown of the semiconductor device 130 can be reduced thereby.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
   a first electrode;
   a first semiconductor region provided on the first electrode and electrically connected to the first electrode, the first semiconductor region being of a first conductivity type;
   a second semiconductor region electrically connected to the first electrode and provided around the first semiconductor region along a first plane crossing a first direction, the first direction being from the first electrode toward the first semiconductor region, the second semiconductor region being of a second conductivity type;
   a third semiconductor region provided on the first semiconductor region and the second semiconductor region, the third semiconductor region being of the first conductivity type, an impurity concentration of the first conductivity type in the third semiconductor region being lower than an impurity concentration of the first conductivity type in the first semiconductor region;
   a fourth semiconductor region provided on a portion of the third semiconductor region, the fourth semiconductor region being of the second conductivity type, an impurity concentration of the second conductivity type in the fourth semiconductor region being lower than an impurity concentration of the second conductivity type in the second semiconductor region;
   a fifth semiconductor region provided selectively on the fourth semiconductor region, the fifth semiconductor region being of the first conductivity type;
   a gate electrode opposing, in a second direction with a gate insulating layer interposed, the fifth semiconductor region, the fourth semiconductor region, and the portion of the third semiconductor region, the second direction being perpendicular to the first direction;
   a sixth semiconductor region provided on another portion of the third semiconductor region, the sixth semiconductor region being of the second conductivity type, an impurity concentration of the second conductivity type in the sixth semiconductor region being higher than the impurity concentration of the second conductivity type in the fourth semiconductor region;
   a second electrode provided on the fourth semiconductor region and the fifth semiconductor region and electrically connected to the fourth semiconductor region, the fifth semiconductor region, and the sixth semiconductor region; and
   an interconnect portion electrically connected to the gate electrode, separated from the second electrode, and provided on the sixth semiconductor region with an insulating layer interposed,
   a proportion of a surface area along the first plane of the first semiconductor region positioned under the sixth semiconductor region to a surface area along the first plane of the second semiconductor region positioned under the sixth semiconductor region being smaller than a proportion of a surface area along the first plane of the first semiconductor region positioned under the fourth semiconductor region to a surface area along the first plane of the second semiconductor region positioned under the fourth semiconductor region.

2. The device according to claim 1, wherein
the sixth semiconductor region is arranged with the gate electrode in a third direction perpendicular to the first direction and the second direction, and
a lower end of the sixth semiconductor region is positioned lower than a lower end of the gate electrode and overlaps, in the first direction with the gate insulating layer interposed, an end portion in the third direction of the gate electrode.

3. The device according to claim 1, wherein the first semiconductor region is not provided under the sixth semiconductor region.

4. The device according to claim 1, wherein
the fourth semiconductor region and the gate electrode are provided alternately in the second direction,
one or more of the fifth semiconductor regions is selectively provided on each of a plurality of the fourth semiconductor regions,
a plurality of the first semiconductor regions is provided to be separated from each other, and
a proportion of a surface area along the first plane of the plurality of first semiconductor regions positioned under the sixth semiconductor region to the surface area along the first plane of the second semiconductor region positioned under the sixth semiconductor region is smaller than a proportion of a surface area along the first plane of the plurality of first semiconductor regions positioned under the plurality of fourth semiconductor regions to a surface area along the first plane of the second semiconductor region positioned under the plurality of fourth semiconductor regions.

5. The device according to claim 4, wherein the sixth semiconductor region is provided around the plurality of fourth semiconductor regions and the plurality of gate electrodes along the first plane.

6. The device according to claim 1, wherein
the first semiconductor region and a portion of the second semiconductor region are provided alternately in a third direction perpendicular to the first direction and the second direction, and
each of a plurality of the first semiconductor regions extends in the second direction.

7. The device according to claim 1, comprising a cell region including the first semiconductor region, a portion of the second semiconductor region, the portion of the third semiconductor region, the fourth semiconductor region, the fifth semiconductor region, and the second electrode,
a plurality of the cell regions being provided to be separated from each other in a third direction perpendicular to the first direction and the second direction,
in each of the plurality of cell regions, a plurality of the first semiconductor regions being provided to be separated from each other in the second direction and the third direction, each of the plurality of first semiconductor regions extending in the second direction,
the second semiconductor region including a trigger region,
a portion of the trigger region being provided in one of the plurality of cell regions and positioned between a portion of the plurality of first semiconductor regions of the one of the plurality of cell regions and another portion of the plurality of first semiconductor regions of the one of the plurality of cell regions in the second direction,
another portion of the trigger region being provided in another one of the plurality of cell regions and positioned between a portion of the plurality of first semiconductor regions of the other one of the plurality of cell regions and another portion of the plurality of first semiconductor regions of the other one of the plurality of cell regions in the second direction, the other one of the plurality of cell regions being adjacent to the one of the plurality of cell regions in the third direction,
a length in the second direction of the trigger region and a length in the third direction of the trigger region being longer than a distance in the third direction between the first semiconductor regions adjacent to each other in the third direction in the one of the plurality of cell regions.

* * * * *